United States Patent [19]

Heuber et al.

[11] 4,007,451
[45] Feb. 8, 1977

[54] METHOD AND CIRCUIT ARRANGEMENT FOR OPERATING A HIGHLY INTEGRATED MONOLITHIC INFORMATION STORE

[75] Inventors: Klaus Heuber, Boeblingen; Wilfried Klein, Holzgerlingen; Knut Najmann, Gaertringen; Rolf Remshardt, Boeblingen; Siegfried K. Wiedmann, Stuttgart, all of Germany

[73] Assignee: International Business Machines Corporation, Armonk, N.Y.

[22] Filed: Nov. 20, 1975

[21] Appl. No.: 633,733

[30] Foreign Application Priority Data

May 30, 1975 Germany ............................ 2523853

[52] U.S. Cl. ...................... 340/173 R; 340/173 FF
[51] Int. Cl.² ..................... G11C 11/23; G11C 7/00
[58] Field of Search .................. 340/173 R, 173 FF

[56] References Cited

UNITED STATES PATENTS 3,736,574  5/1973  Gersbach ...................... 340/173 R

*Primary Examiner*—Stuart N. Hecker
*Attorney, Agent, or Firm*—Wesley DeBruin

[57] ABSTRACT

A method and circuit arrangement for operating an information store, in particular a monolithic information store, whose storage cells and address circuits comprise bipolar transistors which are not continuously subjected to full power. The monolithic information store is readily fabricated by known planar process technology, has increased density, has reduced read/write times, reduced cycle time, and reduced power dissipation.

20 Claims, 5 Drawing Figures

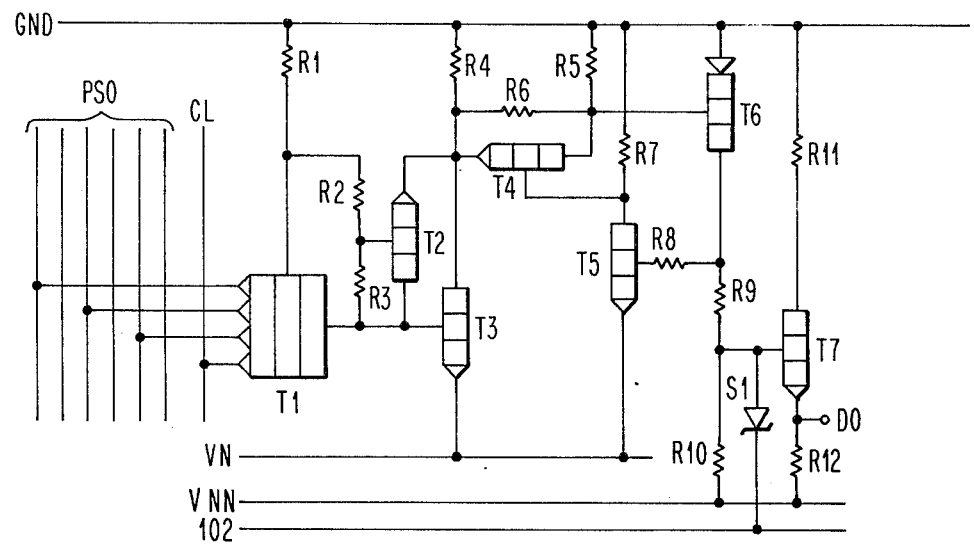
FIG. 4
FIG. 5
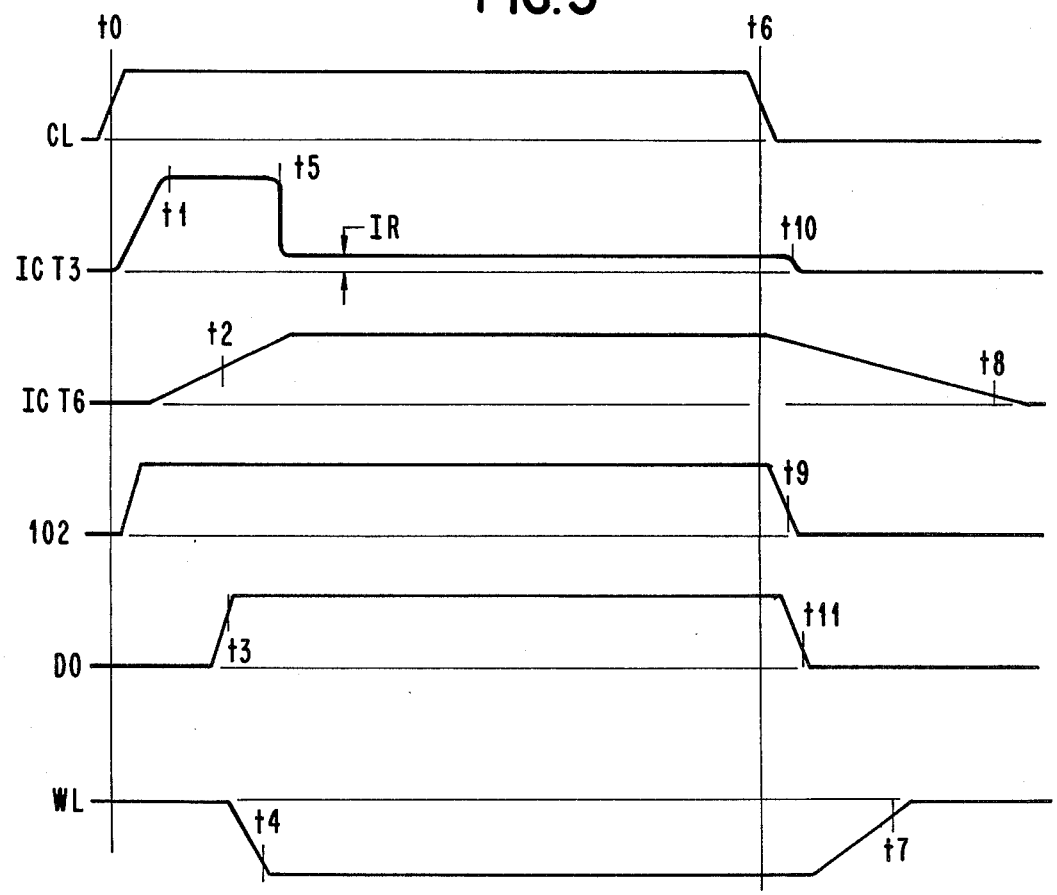

METHOD AND CIRCUIT ARRANGEMENT FOR OPERATING A HIGHLY INTEGRATED MONOLITHIC INFORMATION STORE

BACKGROUND OF THE INVENTION

Reference is made to U.S. Pat. No. 3,621,302 granted Nov. 16, 1971 to W. D. Pricer, entitled "Monolithic-Integrated Semiconductor Array Having Reduced Power Consumption" on application Ser. No. 791,477, filed Jan. 15, 1969 and of common assignee herewith. In U.S. Pat. No. 3,621,302, a single power source is connected to a plurality of parallel-connected storage cells, which are in one of two bistable states, to provide a common constant-current source when the cells are in a standby storage condition and to apply a constant voltage source to increase the power level when the cells are in an active condition.

Reference is made to U.S. Pat. No. 3,573,758, granted Apr. 6, 1971 to R. A. Henle and W. D. Pricer, entitled "Non-Linear Impedance Means for Transistors Connected to Each Other and to a Common Power Source" on application Ser. No. 802,927, filed Feb. 27, 1969 and of common assignee herewith. In U.S. Pat. No. 3,573,758 each of the pair of transistors of a flip-flop storage cell has its collector connected through a nonlinear impedance means to a low constant current source when the cell is in an inactive condition. The nonlinear impedance means for the conducting transistor maintains the ratio of the load impedance means to the base-emitter impedance of the conducting transistor greater than one to maintain the transistors of the cell in the desired bistable state when the transistors are connected to the low constant current source through the nonlinear impedance means.

Reference is made to U.S. Pat. No. 3,688,280, granted Aug. 29, 1972 to J. K. Ayling and R. D. Moore, entitled "Monolithic Memory System with Bi-Level Powering for Reduced Power Consumption" on application Ser. No. 74,432, filed Sept. 22, 1970 and of common assignee herewith. U.S. Pat. No. 3,688,280 discloses a monolithic integrated semiconductor circuit in which both the memory array proper and the addressing and decoding support circuitry are subjected to two power levels, i.e., a low power level when the memory array is in the non-selected or inactive state and a higher level of power necessary to render the decode and address circuitry operational and to make the lines of the array selected by said support circuitry operational for reading and writing into the memory. In order that the time required for the selection of a given line in the memory array, either a row or a column, be held to a minimum, decoding means provide an output which applies to all of the gates associated with each of the rows and/or columns, the preselected patterns required to activate a row or column during the low power or inactive state. Then, during the active state when higher power is applied, the decode circuitry functions to remove the preselected signal necessary to activate a row or column from all of the gates except the gate associated with the column or row to be activated. By functioning in this manner, the circuitry avoids a time lag when the higher level is applied which would otherwise be necessary in order to bring the preselected input signal applied to the selected gate up to the level necessary to activate the selected column or row.

Reference is made to U.S. Pat. No. 3,740,730, granted June 19, 1973 to I. T. Ho and T. S. Jen, entitled "Latchable Decoder Driver and Memory Array" on application Ser. No. 158,316 filed June 30, 1971 and of common assignee herewith. U.S. Pat. No. 3,740,730 discloses a monolithic memory comprising an array of semiconductor storage cells and a plurality of decoders for accessing information to the storage cells during a given duty cycle. Reduced power consumption is achieved by the application of addressing signals to the decoder input lines for a given time period less than the accessing duty cycle in order to attain full duty cycle activating signals on the decoder output lines for accessing the memory array, and also by virtue of the selected address input lines associated with a selected decoder not drawing current during the given time period.

Reference is made to U.S. Pat. No. 3,764,833 granted Oct. 9, 1973 to J. K. Ayling and R. D. Moore, entitled "Monolithic Memory System with Bi-Level Powering for Reduced Power Consumption" on application Ser. No. 255,897 filed May 22, 1972 and of common assignee herewith. U.S. Pat. No. 3,764,833 discloses an intermittently powered true-complement generator circuit which comprises means for intermittently applying power to said circuit and generator means for receiving a single binary signal bit input prior to the application of said power and for providing a two terminal true-complement output representative of said input only when said power is applied, said generator means providing an output in the up binary state on each of the two output terminals during periods after said signal bit is received and before power is applied.

A prerequisite for the manufacture of a highly integrated information store, or monolithic memory, is to keep the power consumption and dissipation of the storage or memory cells and the address circuits, such as the decoder and/or driver circuits, as low as possible. This is necessary because the thermal load resulting from the power intake of the store is an essential bar to higher integration densities. Therefore, in the past the art has disclosed and proposed a number of techniques for reducing the power consumption of the storage cells. To this end the supply voltage and/or the supply current, rather than being applied continuously or statically, is applied only at particular times or by way of pulses. In order to increase the integration density, it is known from the U.S. Pat. No. 3,573,758 to design the decoder circuits so that they can be pulse operated. This means that the decoder circuits are kept at a particular level only when no access is made or when reading or writing is not carried out. However, when particular storage areas are to be accessed in a given operating cycle, the input lines to the decoder drivers in accordance with this patent are raised to a necessarily high level for the whole cycle. As this operational mode of the decoder circuits is not fully adequate to reduce the power requirements as desired, U.S. Pat. No. 3,740,730 discloses a method and a circuit arrangement for operating an information store by means of which the development of heat in monolithic semiconductor stores is decreased still further. To this end latches are operated in such a manner that only during the short time required for setting the selected latches when the storage cell to be accessed is addressed, is current withdrawn from the address lines of the selected driver circuits, while in the remaining cycle time during which these latches are in their latched state the addressed storage cells are subjected to the driver currents. Although in this case the power requirements of a monolithic store are reduced still further by the latches, the solution in accordance with U.S. Pat. No. 3,740,730 is not without shortcomings. The shortcomings are: the power requirements of a highly integrated store are still too high; the cycle time is not reduced; and complicated monolithic structures are necessary for realizing the circuit arrangement.

SUMMARY OF THE INVENTION

The method of operating a monolithic memory (or informaton store) and the circuit arrangement for carrying out the method, each in accordance with the invention, are summarized in the following numbered paragraphs:

1. A method of operating an information store, in particular a monolithic information store, whose storage cells and address circuits include bipolar transistors which are not continously subjected to full power, characterized in that the address circuits, in particular the decoders, are subjected to the full voltage both in the selected and the non-selected state, that at the beginning of a selection phase the current in the selected decoders increases disproportionally as a result of control signals controlled by a clock signal, subsequently dropping to a residual current, in order to keep the selected decoders in the selected state, and that at the end of a selection cycle the decoders are immediately controlled into their non-selected state as a function of the drop in the control signals.

2. A method in accordance with numbered paragraph (1), supra, characterized in that two-stage decoders are provided to address the word lines of the monolithic information store, that the first stage includes base and emitter decoders, the second stage includes word line transistors arranged in a matrix and controlled by input signals in such a manner that only one word line transistor is selected and the selected word line is pulled down in potential by a clock signal and is returned to its original level subsequent to the termination of the clock signal.

3. A method in accordance with numbered paragraph (2), supra, characterized in that by applying input signals to the inputs of the base and emitter decoders forming the first stage, while the clock rises, the respective decoder is switched on at the beginning of the selection phase, that a first transistor of the decoder changes from the switched on to the switched off state, causing a second transistor of the decoder to be switched on, that its collector potential is pulled down, causing a third transistor of the decoder to be switched on, so that a high current flows, which causes the collector current of a connected PNP transistor to rise very rapidly, thus causing a fourth transistor to whose base a control signal synchronized by the clock signal is applied, to be switched on very rapidly, that subsequently the output signal of the first stage of the decoder for directly addressing the word line transistors also increases, and that the collector current of the second transistor drops to a residual current to keep the PNP transistor in the switched on state until the time at which the control signal drops to its lower level, causing the collector current of the second transistor to be pulled down at the end of a selection cycle, so that the respective word line transistor selected is immediately controlled into the non-selected state.

4. A circuit arrangement for implementing the method of operating an information store in accordance with the numbered paragraph (1), supra characterized in that for selecting the storage cells of the monolithic information store designed in matrix shape, a matrix decoder is provided, that at each of the cross points of this matrix decoder one word line transistor each is arranged, that in each case the collector of one word line transistor is connected to only one of the word lines, that the base of the word line transistor is connected to the output of a base decoder and the emitter of the word line transistor to the output of an emitter decoder which are linked with a common control circuit, the latter determining the beginning and the end of a selection phase under the control of a clock.

5. A circuit arrangement in accordance with numbered paragraph (4), supra, characterized in that the base decoder and the emitter decoder for addressing the decoder matrix are substantially identical.

Therefore, a primary object of the invention is to provide a method of operating a highly integrated information store, which permits increasing the integration density still further, which simultaneously permits increasing the read/write speed, which utilizes a relatively simple readily producible monolithic structure, and which employs an efficient reliable, novel and unobvious circuit arrangement for implementing the method.

A primary object of the invention is to provide an improved high density monolithic memory array.

A primary object of the invention is to provide an improved address circuit means for use in a highly integrated monolithic memory array.

A primary object of the invention is to provide an improved decoder circuit for use in a high density monolithic circuit structure.

A further object of the invention is to provide a high density monolithic memory array which consumes a minimum amount of electrical energy.

A further object of the invention is to provide an improved decoder circuit means having particular utility in a monolithic circuit structure such as a high density monolithic memory array.

In accordance with the invention, the integration density is increased. The read/write times and thus the cycle time of the store is reduced, and the power dissipation is reduced. Namely, by practicing the invention a practical readily producible monolithic structure of the storage cells with the address circuits in an information store is provided which in addition to low power requirements permits cycle times coming within the nanosecond range being obtained in a monolithic memory fabricated by known planar technological processes. Further, as will be apparent to persons skilled in the art, the tolerances are such that manufacture can be carried out without the use of complicated devices.

Further, in accordance with the invention, although the non-selected decoders are subjected to the full supply voltage, their power dissipation is practically negligible. By driving the PNP transistor of the decoder quasi-dynamically, switching times are obtained which are less than the emitter time constant of this transistor. In addition, the storage time during switching off is short, since the static overdrive is kept low.

The foregoing and other objects, features and advantages of the invention will be more apparent from the following more particular description of the preferred embodiment of the invention, as illustrated in the accompanying drawings.

BRIEF DESCRIPTION OF THE DRAWINGS

In the drawings:

FIG. 4 is a decoder circuit in accordance with the preferred embodiment of the invention and for use in a store in accordance with FIGS. 1 and 2.

FIG. 5 is an idealized waveform diagram to be viewed in conjunction with the explanation of the operation of the decoder circuit of FIG. 4.

PREFERRED EMBODIMENT

Figure 1:
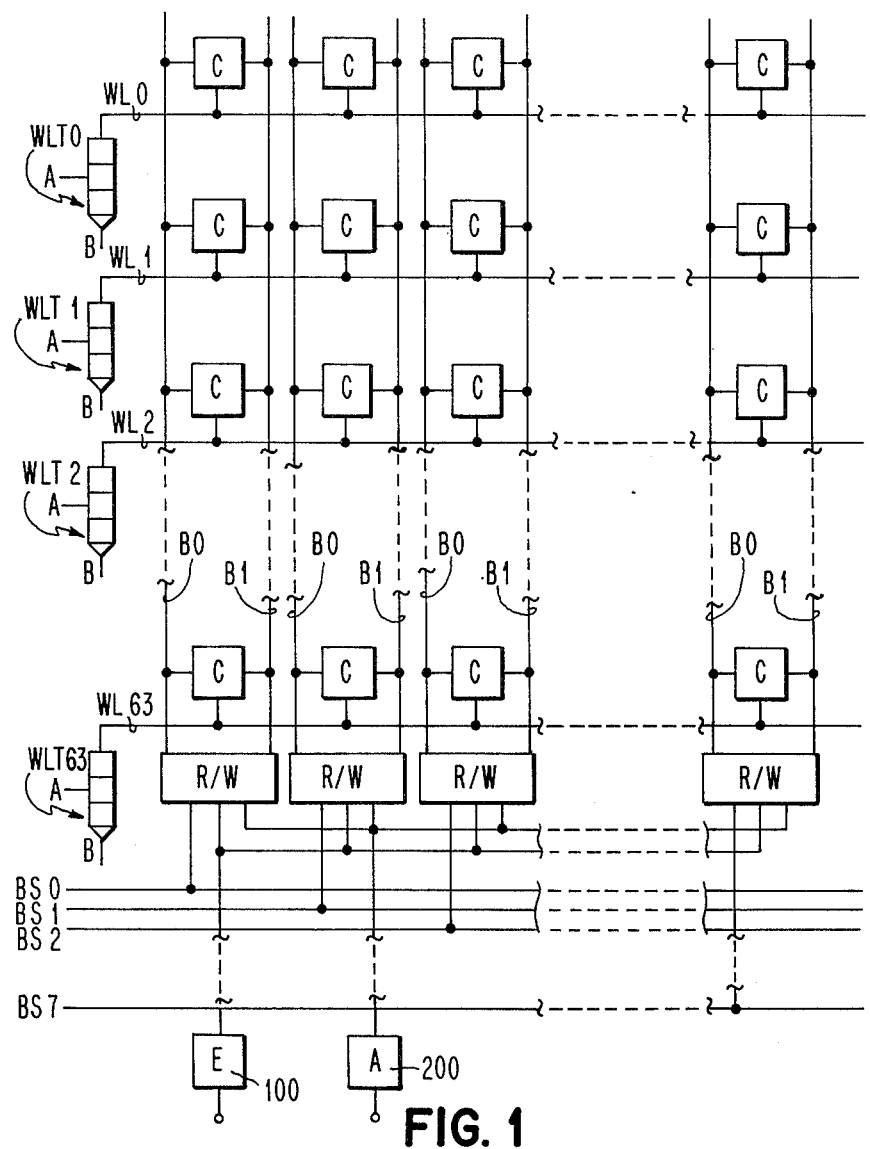
FIG. 1 is a circuit diagram of a word-organized store or monolithic memory in accordance with the invention.

The information store depicted in FIG. 1 includes storage cells C which are connected row-by-row via word lines WL0 to WL63. The storage cells C are connected column-by-column to bit lines B0 and B1. The bit lines B1 and B0 for each column are connected to a read/write circuit R/W which in turn is connected to a common input circuit 100 and a common output circuit 200. A complete store has 10 storage levels of the type shown in FIG. 1. Each level has eight columns and 64 word lines. The bits are addressed via the bit selection lines BS 0 to BS 7 which are selectively connected to the read/write circuits R/W.

Figure 2:
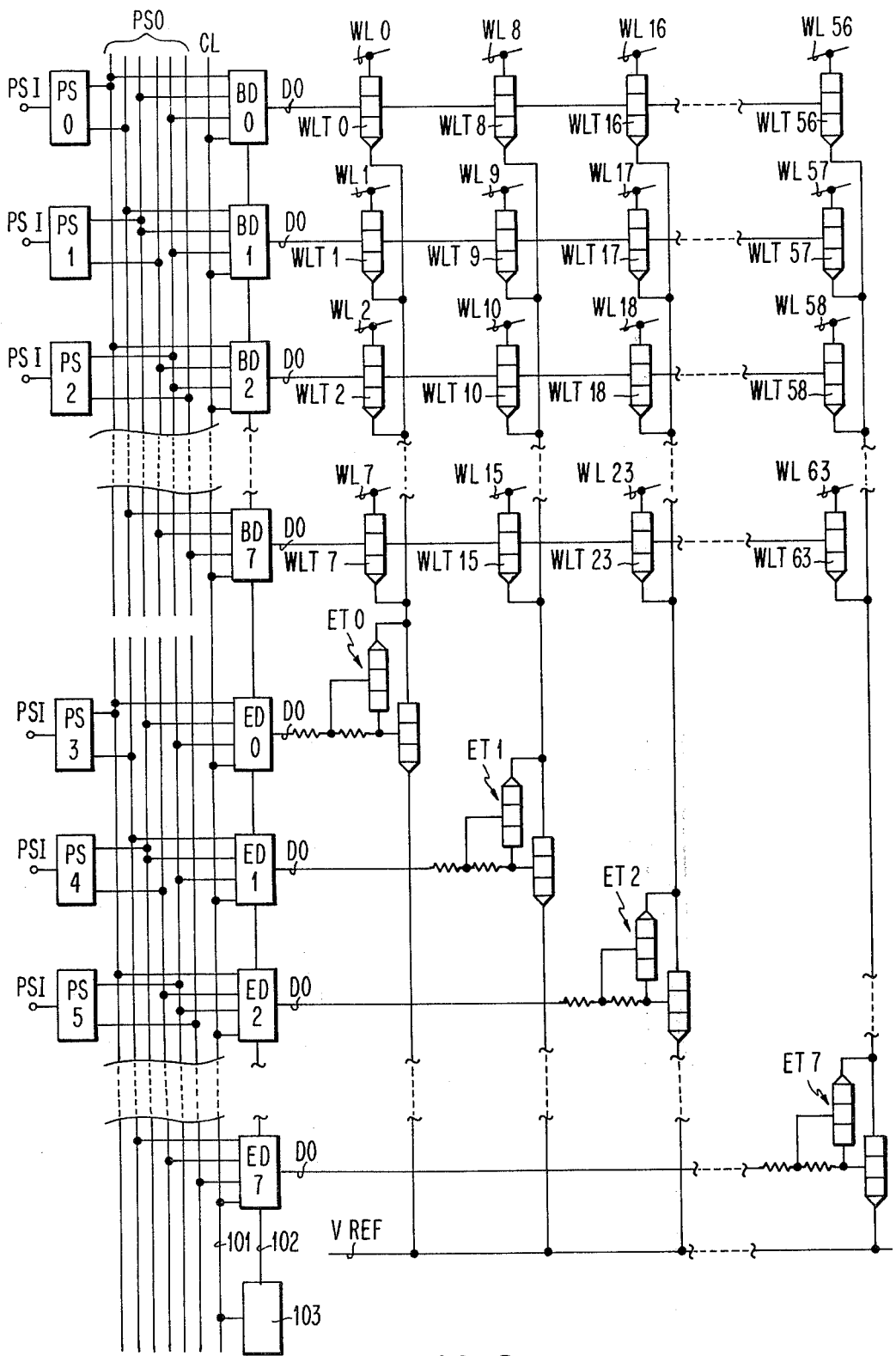
FIG. 2 is a circuit diagram of a memory decoder in accordance with the invention for the store of FIG. 1.

The storage cells C may be flip-flops employing bipolar transistors. Cross-coupled flip-flops with Schottky diodes as coupling elements are particularly suitable for this purpose. Each word line WL0 to WL63 is addressed via a word line transistor WLT 0 to WLT 63, whose base is controlled on terminal A by base decoder BD (FIG. 2) and whose emitter is controlled on terminal B by emitter decoder ED (FIG. 2). The base decoders BD and emitter decoders ED will be described in detail hereinafter with reference to FIG. 2.

FIG. 2 shows a circuit diagram of a memory decoder for the store of FIG. 1. The decoder of FIG. 2 is a matrix decoder comprising word line transistors WLT0 to WLT63, base decoders BD0–BD7, which are preceded by phase splitters PS0–PS21, and emitter decoders ED0–ED7, which in turn are preceded by phase splitters PS3–PS5. The base decoders BD and the emitter decoders ED are very similar, or may be identical, circuits. The emitters of the word line transistors (WLT 0-WLT 63) in the decoder matrix are addressed by the emitter drivers ET0 –ET7. As shown in FIG. 2, the base decoders are selectively connected to the bases of the word line transistors, whereas the emitter decoders are selectively connected to the emitters of the word line transistors via the emitter drivers. The base decoders BD and the emitter decoders ED are connected via two common lines 101 and 102 to clock CL and to control circuit 103 which is also controlled by clock CL.

The operation of the store of FIGS. 1 and 2 will be described below with reference to the waveform timing diagram of FIG. 3.

Figure 3:
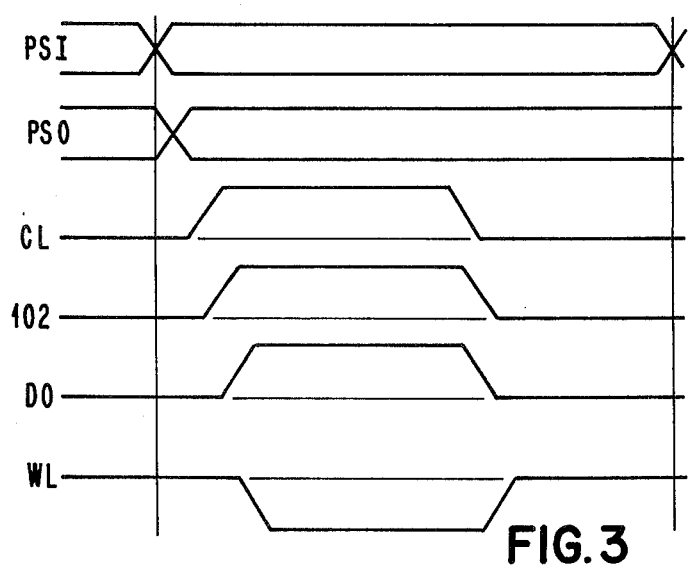
FIG. 3 is an idealized waveform diagram to be viewed in conjunction with the explanation of the operation of the circuit diagrams of FIGS. 1 and 2.

The waveform timing diagram of FIG. 3 shows the selected and the non-selected state of the storage arrangement in accordance with FIGS. 1 and 2. The cycle shown applies both to the writing and the reading of information.

When an UP level input signal is available on the input PSI of each of the phase splitters PS 0 to PS 5 (FIG. 2), both the base decoder BD 0 and the emitter decoder ED 0 is selected. Thus, as shown in FIG. 2, only the word line transistor WLT 0 of the decoder matrix is addressed, i.e., it drives its word line WL0 (FIG. 1) DOWN. The time at which the word line WL0 is pulled DOWN is determined by the clock signal CL on line 101. The clock signal CL causes an output signal (DO) from the base decoder BD 0 and from the emitter decoder ED 0, as shown in the last but one line of the timing diagram (FIG. 3). Slightly delayed, as a result of the transistor switching times, the word line WL 0 is pulled down. Reference is made to the waveform labelled WL in the timing diagram of FIG. 3.

As shown in FIG. 3, the output signal on line 102 of the control circuit 103 controls the switching off of the selected base decoder BD and the selected emitter decoder ED. The exact time sequence and operation will be described in detail hereinafter with reference to FIGS. 4 and 5.

FIG. 4 shows the quasi-dynamic circuit which may be employed for the base decoder (BD) as well as the emitter decoder (ED). The circuit comprises on the left the lines PS 0 (see FIG. 2) which are connected to the outputs of the phase splitters PS. In accordance with the invention and as depicted in FIG. 2, these lines ae connected to the input side of a multi-emitter transistor T1 (FIG. 4) operating as an AND circuit. The lower input of the AND gate, designed as a multi-emitter transistor T1, is connected to the line carrying the clock signal CL. The base of the transistor T1 is connected to ground GND, via resistor R1, to supply base current. The base resistor R1 is also connected to the collector of transistor T1 via serially connected resistors R2 and R3. The collector of transistor T1 is connected to the base of a transistor T3. Transistor T2 serves to clamp the voltage level for the collector of transistor T3 (in the switched on state of T3). To this end, transistor T2 has its base connected to the node of serially connected resistors R2 and R3, its collector connected to the base of transistor T3, and its emitter to the collector of transistor T3. The load resistor R4 is connected between ground GND and the collector of transistor T3. The emitter of transistor T4 is connected to the collector of transistor T3. In parallel to the emitter/collector path of transistor T4 a resistor R6 is connected. The common node formed by the collector of transistor T4 and one end of resistor R6 is connected to the base of an PNP transistor T6. A base-emitter bias resistor R5 is connected between the base and emitter of the PNP transistor T6. The emitter of the PNP transistor T6 is connected to ground GND. The control current for the base of transistor T4 is determined by a resistor R7 which is connected between ground GND and in common to the base of transistor T4 and the collector of a transistor T5. As is the emitter of transistor T3, the emitter of transistor T5 is connected to a negative voltage source VN. The current for the base of transistor T5 is determined via a resistor R8 which is connected between the base of transistor T5 and the collector of the PNP transistor T6. Also connected to the collector of the PNP transistor T6 is a resistor R9 supplying the base current for a transistor T7 used as an output emitter follower. A bias resistor R10 is connected between the base of transistor T7 and a negative potential source VNN. The negative potential source VNN is more negative in potential than potential source VN. The emitter resistor R12 is connected between the potential VNN and the emitter of transistor T7. The collector of transistor T7 is connected to ground GND via a resistor R11. A Schottky diode S1, via which the signal 102 from the control circuit 103 is applied, is connected to the base of transistor T7. Transistor T7 functions as an emitter follower with the output DO (FIGS. 2 and 4) taken from the emitter of transistor T7.

The operation of the decoder circuit of FIG. 4 will be described and explained in detail below with reference to the waveform timing diagram of FIG. 5. The left-hand portion, to the left of the vertical line labelled t0 in the waveform timing diagram of FIG. 5, the stand-by state of the quasi-dynamic decoder of FIG. 4 is depicted. The clock signal CL and the control signal 102 are at their negative potential. Thus, the following conditions (levels and currents) are present within the circuit of FIG. 4 when it is a non-selected or stand-by state.

Transistor T1 on ON and a base current flows via resistor R1 into transistor T1. This provides a switch OFF potential on the base of transistor T3. Transistor T3 is OFF. Due to resistor R4 the collector of transistor T3 is practically at ground potential resulting in a switch OFF potential on the base of PNP transistor T6. In the waveform timing diagram of FIG. 5, the two collector currents IC T3 and IC T6 of the two transistors T3 and T6 are shown, prior to time t0, to be zero milliamperes. As a result of this, transistors T4 and T5 are blocked. As the collector potential of the PNP transistor T6 is at VNN at this time, transistor T7, connected as an emitter follower, is also OFF.

Because of control circuit 103 line 102 has a potential of almost VNN, which at this time is of no significance to the circuit. The selection phase which is depicted to the right of the vertical line labelled t0 in FIG. 5 will be described below.

When binary UP signals are applied to the inputs PS0 of transistor T1 of te decoder in FIG. 4, and the clock signal CL increases at the time t0, the decoder is in the selected state, i.e., it is switched ON. The time sequences will be described below by means of the waveform timing diagram of FIG. 5. Namely, when each of the emitters of transistor T1 has an UP level binary signal impressed thereon, transistor T1 is OFF, namely non-conductive. The non-conductive condition of transistor T1 results in transistor T3 being switched ON. The base current of transistor T3 is applied via serially connected resistors R1, R2 and R3. Because transistor T3 is switched ON, its collector potential is pulled down, causing transistor T4 to be switched ON. At the time t1, FIG. 5, a relatively high collector current ICT 3 flows along the emitter base path of transistor T6 and the collector emitter path of transistor T4 to the collector of transistor T3. See waveform ICT 3 in FIG. 5. This means that at this time, t1, the collector current ICT 3 is essentially determined by the internal transistor resistances of transistors T6, T4 and T3. This current is essentially equal to the emitter current of PNP transistor T6. This high current results in the collector current ICT 6 of PNP transistor T6 rising very rapidly. See waveform ICT 6 in FIG. 5, in particular at time t2. Without this overdriving, the collector current of PNP transistor T6 would rise substantially less rapidly. The rapid increase in the collector current ICT 6 leads to transistor T7 being rapidly switched ON at the time t3, as depicted in FIG. 5. The resulting increase in the output signal D0 of the decoder causes the corresponding word line transistor WLT to be switched ON. In the diagram of FIG. 5 t4 indicates the time at which word line WL is selected.

It is pointed out once again that for selecting a word line transistor WLT in the decoder matrix (FIG. 2), two decoders have to be excited, or selected, namely, a base decoder BD and an emitter decoder ED.

After transistor T7 has been switched ON, it is no longer necessary for the high collector current ICT 3 to continue. It is desirable to keep this current as low as possible. To this end transistor T7 and transistor T5 are concurrently addressed by PNP transistor T6 via resistor R8. This switches ON transistor T5 and raises the base potential of transistor T4 to VN (FIG. 4). Transistor T4 is switched OFF in consequence, and the collector current ICT 3 is reduced by resistor R6. Thus the collector current ICT 3 and the base current of T6 are no longer governed by the internal resistances of transistors T6, T4 and T3. The drop in the current ICT 3 at the time t5 is shown in the waveform timing diagram, FIG. 5. The residual current IR which may also be seen from this diagram is sufficient to keep PNP transistor T6 switched ON until time t10. Even with relatively long selection times the residual currents in the decoder are kept very low, which leads to extremely low power dissipation, even though the decoder is switched ON very rapidly at the beginning of the selection phase. At the end of a selection cycle, at the time t6 in the timing diagram of FIG. 5, the clock CL drops, switching ON transistor T1. This leads to transistor T3 being switched OFF at the time t10, which in turn causes transistor T4 and PNP transistor T6 to be switched OFF. As may be seen from the timing diagram of FIG. 5, after t6 time, the collector current ICT 6 drops slowly, and thus transistor T7 is correspondingly switched OFF slowly at the time t8. In order to speed up the switching OFF process of transistor T7, a signal 102 is applied to the base of transistor T7 via Schottky diode S1 under the control of control circuit 103 at the time t9. This leads to the output signal D0 being pulled down as early as t11, rather than at the time t8. This causes the selected word line transistor WLT — (depicted in FIG. 5 is the collector potential on word line WL) — to be switched OFF and the word line to assume its non-selected state at the time t7. This returns the decoder to its original state, i.e., non-selected state.

While the invention has been described and shown particularly with reference to one of its preferred embodiments, it will be understood by those skilled in the art to which the work is directed that various changes in form and detail may be made without departing from either the spirit or scope of the invention.

What is claimed is:

1. A method of operating an information store, in particular a monolithic information store, whose storage cells and address circuits comprise bipolar transistors which are not continuously subjected to full power. characterized in that the address circuits, in particular the decoders, are subjected to full voltage both in the selected and the non-selected state, that at the beginning of a selection phase the current (ICT3) in the selected decoders (BD and ED) increases disproportionally as a result of control signals (102) controlled by the clock (CL), subsequently dropping to a residual current (IR), in order to keep the selected decoders (BD or ED) in the selected state, and that at the end of a selection cycle the decoders (BD and ED) are immediately controlled into their non-selected state as a function of the drop in the control signal (102).

2. A method in accordance with claim 1, characterized in that two-stage decoders (BD, ED and WLT0 to WLT63) are provided to address the word lines (WL) of the monolithic information store, that the first stage consisting of base and emitter decoders, the second stage consisting of word line transistors (WLT0 to WLT63) arranged in a matrix are controlled upon application of input signals (PSI) in such a manner that only one word line transistor (e.g., WLT0) is addressed on both on the base and the emitter, thus causing the potential of the connected word line (WL0) to be pulled down by clock (CL) and to be returned to the original level after clock (CL) has dropped.

3. A method in accordance with claim 2, characterized in that by applying input signals to the inputs (PS0) of the selected base and emitter decoders (BD and ED) forming the first stage, while the clock (CL) rises, the respective decoders are switched on at the beginning of the selection phase, that a transistor (T1) changes from the switched on state to the switched off stage, causing a further transistor (T3) to be switched on, that its (T3) collector potential is pulled down, causing a furthur transistor (T4) of each selected decoder (BD and ED) to be switched on, so that a high current flows, which leads to the collector current (ICT6) of a connected PNP transistor (T6) to rise very rapidly, thus causing a further transistor (T7), to whose base a control signal synchronized by the clock signal (CL) is applied, to be switched on very rapidly, that subsequently the output signal (D0) of the first stage (BD and ED) of the decoder for directly addressing the word line transistors also increases, and that the collector current (ICT3) of the transistor (T3) drops to the residual current (IR) to keep the PNP transistor (T6) in the switched on state until the time ($t10$) at which the control signal (102) drops to its lower level ($t9$), causing the collector current (ICT3) of transistor (T3) to be pulled down at the end of a selection cycle, so that the respective word line transistor (WLT) selected is immediately controlled into the non-selected state.

4. A circuit for implementing the method of operating an information store in accordance with claim 1, characterized in that for selecting the storage cells of the monolithic information store designed in matrix shape a matrix decoder (WL0 to WL63) is provided, that at each cross point of this matrix decoder one word line transistor (WLT0 to WLT63) is arranged, that in each case the collector of one word line transistor (WLT0 to WLT63) is connected to only one of the word lines (WL0 to WL63), that the base is connected to the output of a base decoder and the emitter to the output of an emitter decoder which are linked with a common control circuit (103), the latter determining the beginning and the end of a selection phase under the control of a clock (CL).

5. A circuit as recited in claim 4, characterized in that the base decoders (BD) and the emitter decoders (ED) for addressing the decoder matrix (WLT0 to WLT63) are identical.

6. A circuit as recited in claim 5, characterized in that each base decoder (BD) and each emitter decoder (ED) is made up of a multi-emitter transistor (T1) acting as an AND gate, and to whose inputs the clock signal (CL) and the input signals are applied and whose base is connected to ground (GND) via a resistor (R1) and to the collector via resistors (R2 and R3), said multi-emitter transistor being also connected to the base of a further transistor (T3), that the collector of this transistor (T3) is connected to ground (GND) via a resistor (R4) and to the emitter of a transistor (T4), that parallel to the emitter-collector path of the transistor (T4) a resistor (R6) is connected, that the common node is linked to the base of a transistor (T6) having a base-emitter bias resistor (R5) between base and emitter and whose emitter is connected to ground (GND), that the control current for the base of the transistor (T4) is determined by a resistor (R7) arranged between ground (GND) and the collector of a transistor (T5), whose emitter is connected to the same negative voltage (VN) as the emitter of the transistor (T3), that the base current of the transistor (T5) is determined via a resistor (R8) linked with the collector of the transistor (T6) which is furthermore connected to a resistor (R9) supplying the base current for a transistor (T7) connected as an output emitter follower and between whose base and a negative potential (VNN) a bias resistor (R10) is arranged, that in addition, an emitter resistor (R12) is provided between this potential (VNN) and the emitter of the transistor (T7), the collector of said transistor (T7) being linked to ground (GND) via a resistor (R11), whereas the base of said transistor (T7) is connected to a Schottky diode (S1) which in turn is connected to a control circuit (103).

7. A circuit as recited in claim 6, characterized in that upon the simultaneous application of input signals and a clock signal (CL) at the beginning of the selection phase ($t0$) the selected decoders (BD and ED) are switched to the selected state, that in each of the two selected decoders (BD and ED) the transistor (T1) changes to the switched off state, switching on the transistor (T3), whose collector potential is pulled down, that as a result of this, the transistor (T4) is switched on, and that at a further time ($t1$) the main part of the very high collector current (ICT3) flows via the emitter base path of the transistor (T6), the collector emitter path of the transistor (T4) to the collector of the transistor (T3), that as a result of this, the collector current (ICT6) of the transistor (T6) rises very rapidly (time $t2$) causing the transistor (T7) to be switched on very rapidly at the time ($t3$), so that a selected word line transistor (WLT) in the decoder matrix is immediately switched on (time $t4$), that at a further time ($t5$) the collector current (ITC3) of transistor (T3) drops to the residual current (IR), keeping the transistor (T6) switched on until the proposed end ($t10$) of the selection phase, that subsequently to $t5$ and prior to $t10$ (at $t6$) the clock pulse (CL) drops, so that the multi-emitter transistor (T1) is again switched on, causing the transistors (T3, T4 and T6) to be actually switched off at the time ($t10$), since the control signal (102) from the control circuit (103) is applied to the base of the transistor (T7) via the Schottky diode (S1).

8. A circuit as recited in claim 7 characterized in that the transistor (T6) is a PNP transistor whereas all the other transistors present in the decoders are of the NPN type.

9. A monolithic decoder circuit for use in a monolithic information store, said decoder circuit comprising:
 a first transistor having a plurality of emitters, a base and collector;

second, third, fourth, fifth and sixth transistors each having an emitter, base and collector;

a seventh transistor having an emitter, base and collector, said seventh transistor being of a conductivity type opposite to the conductivity type of said first through seventh transistors;

first means for providing first, second and third potentials, where said first, second and third potentials are respectively unequal in magnitude;

a clock source for providing periodic clock signals;

a control source for providing periodic control signals, said clock and control signals having a like periodicity, said clock and control signals being displaced in time;

a first resistor connected between said base of said first transistor and said first potential;

a second resistor connected between said base of said first transistor and said base of said second transistor;

a third resistor connected between said base and said collector of said second transistor;

means directly connecting in common said collector of said first transistor, said collector of said second transistor and said base of said third transistor;

means directly connecting in common said emitter of said second transistor, said collector of said third transistor and said emitter of said fourth transistor;

a fourth resistor connected between said emitter of said fourth transistor and said first potential;

a fifth resistor connected beween said collector of said fourth transistor and said first potential;

a sixth resistor connected between said emitter and said collector of said fourth transistor;

a seventh resistor connected between said collector of said fifth transistor and said first potential;

means directly connecting said base of said fourth transistor to said collector of said fifth transistor;

means directly connecting said emitter of said third transistor and said emitter of said fifth transistor to said second potential;

an eighth resistor connected between said base of said fifth transistor and said collector of said seventh transistor;

means directly connecting said base of said seventh transistor to said collector of said fourth transistor;

means directly connecting said emitter of said seventh transistor to said first potential;

a ninth resistor connected between said collector of said seventh transistor and said base of said sixth transistor;

a tenth resistor connected between said base of said sixth transistor and said third potential;

an eleventh resistor connected between said collector of said sixth transistor and said first potential;

a twelfth resistor connected between said emitter of said sixth transistor and said third potential;

means directly connecting one of said plurality of emitters of said first transistor to said clock source; and a Schottky Barrier diode connected between said base of said sixth transistor and said control source.

10. In a monolithic memory chip for storing binary data, said memory chip including:

an array of storage cells electrically arranged in one through $m$ columns and one through $n$ rows, whereby said memory includes $m \times n$ storage cells, each storage cell having the capacity to store a binary bit of data, and where $m$ and $n$ are positive integers;

$n$ word lines, each of said $n$ word lines connected to a discrete group of $m$ of said storage cells;

$n$ word line transistors, each of said word line transistors having an emitter, base and collector, said $n$ word line transistors being electrically arranged in a matrix having $p$ columns and $r$ rows where $p$ and $r$ are integers and $p \times r$ is equal to $n$;

connection means connecting the collector of each of said $n$ word line transistors to a discrete one of said $n$ word lines;

$r$ base decoder circuits, each of said $r$ base decoder circuits having an output connected in common to the base of each word line transistor of a discrete group of $p$ word line transistors of said $n$ word line transistors;

$p$ emitter decoder circuits, each of said $p$ emitter decoder circuits having an output connected to the emitter of each word line transistor of a discrete group of $r$ word line transistors of said $n$ word line transistors;

selection means selectively coupled to said $r$ base decoder circits and said $p$ emitter decoder circuits for selecting any predetermined one of said $r$ base decoder circuits and concurrently therewith selecting any predetermined one of said $p$ emitter decoder circuits, whereby only a single predetermined word line transistor of said $p \times r$ word line transistors is selected and only a single predetermined one of said $n$ word lines is selected.

11. In a monolithic memory chip as recited in claim 10 wherein said selection means includes 1 through $k$ phase splitters where $k$ is a positive integer determined by the relationship $2^k = p \times r = n$, each of said phase splitters having an input adapted to receive a binary input $A_k$ and provide a true output $A_k$ and a complement output $\bar{A}_k$, whereby a binary word comprised of binary bits $A_1$ through $A_k$, respectively impressed on said inputs of said 1 through $k$ phase splitters selects a single base decoder, a single emitter decoder and the word line transistor having its base connected to said selected base decoder and its emitter connected to said selected emitter decoder.

12. In a monolithic memory chip as recited in claim 11 wherein said binary word comprised of binary bits $A_1$ through $A_k$ constitutes a word line address and where additional controllable circuit means is provided for writing binary data into the $m$ memory cells connected to the selected word line connected to the collector of the selected word line transistor, or for reading binary data from the $m$ memory cells connected to said selected word line.

13. In a monolithic memory chip as recited in claim 12, where said additional controllable means includes bit addressing means for addressing any predetermined one of said $m$ memory cells connected to said selected word line, whereby binary data may be written into, or read from, any predetermined memory cell of said $m$ memory cells of said monolithic memory chip.

14. In a monolithic memory chip as recited in claim 13 wherein $m$ has the integer value eight, $n$ has the integer value 64, $m \times n$ has the integer value 512, $p$ has the integer value eight, $r$ has the integer value eight, and $k$ the integer value six.

15. In a monolithic memory chip as recited in claim 10, where said $r$ base decoder circuits respectively comprise:

a first transistor having a plurality of emitters, a base and collector;

second, third, fourth, fifth and sixth transistors each having an emitter, base and collector;

a seventh transistor having an emitter, base and collector, said seventh transistor being of a conductivity type opposite to the conductivity type of said first through seventh transistors;

first means for providing first, second and third potentials, where said first, second and third potentials are respectively unequal in magnitude;

a clock source for providing periodic clock signals;

a control source for providing periodic control signals, said clock and control signals having a like periodicity, said clock and control signals being displaced in time;

a first resistor connected between said base of said first transistor and said first potential;

a second resistor connected between said base of said first transistor and said base of said second transistor;

a third resistor connected between said base and said collector of said second transistor;

means directly connecting in common said collector of said first transistor, said collector of said second transistor and said base of said third transistor;

means directly connecting in common said emitter of said second transistor, said collector of said third transistor and said emitter of said fourth transistor;

a fourth resistor connected between said emitter of said fourth transistor and said first potential;

a fifth resistor connected between said collector of said fourth transistor and said first potential;

a sixth resistor connected between said emitter and said collector of said fourth transistor;

a seventh resistor connected between said collector of said fifth transistor and said first potential;

means directly connecting said base of said fourth transistor to said collector of said fifth transistor;

means directly connecting said emitter of said third transistor and said emitter of said fifth transistor to said second potential;

an eighth resistor connected between said base of said fifth transistor and said collector of said seventh transistor;

means directly connecting said base of said seventh transistor to said collector of said fourth transistor;

means directly connecting said emitter of said seventh transistor to said first potential;

a ninth resistor connected between said collector of said seventh transistor and said base of said sixth transistor;

a tenth resistor connected between said base of said sixth transistor and said third potential;

an eleventh resistor connected between said collector of said sixth transistor and said first potential;

a twelfth resistor connected between said emitter of said sixth transistor and said third potential;

means directly connecting one of said plurality of emitters of said first transistor to said clock source; and a Schottky Barrier diode connected between said base of said sixth transistor and said control source.

16. In a monolithic memory chip as recited in claim 15 wherein the circuitry of each of said $p$ emitter decoder circuits is identical to the circuitry of each of sais $r$ base decoder circuits.

17. In a monolithic memory chip as recited in claim 10 wherein said selected base decoder circuit of said $r$ base decoder circuits and said selected emitter circuit of said $p$ emitter decoder circuits are concurrently actuated by a clock signal from a clock source and thereafter concurrently de-actuated by a control signal from a control source driven by said clock signal.

18. In a monolithic memory chip as recited in claim 10 wherein each of said $r$ base decoder circuits and said $p$ emitter decoder circuits are identical, each of said decoder circuits comprising:

an output driver stage;

fast turn-on over drive circuit means connected between said driver stage and said selection means, said fast turn-on over drive means including, a first transistor of a first conductivity type having a collector, base and emitter, second and third transistors of a second conductivity type opposite to said first conductivity type, said second and third transistors each having a collector, base and emitter, a direct connection between the base of said first transistor and said collector of said second transistor, a direct connection between the emitter of said second transistor and said collector of said third transistor, and a resistor connected across the emitter/collector of said second transistor.

19. In a monolithic memory for storing binary data, said memory comprising:

an array of memory cells having $m$ columns and $n$ rows where $m$ and $n$ are integers and said memory array includes $m \times n$ memory cells, where each of said cells has the capacity to store one binary data bit and each of said $n$ rows of memory cells has the capacity to store a binary word having $m$ binary data bits;

$n$ word lines, each of said $n$ word lines being connected to the memory cells of a single one of said $n$ rows of memory cells;

a matrix of word line transistors each having an emitter, base and collector, said matrix having $r$ columns and $r$ rows, whereby the number of word line transistors included in said matrix is $r^2$, and $r^2$ is equal to $n$;

connection means connecting the collector of each said $n$ word line transistors to a discrete one of said $n$ word lines;

$r$ base decoder circuits, each of said $r$ base decoder circuits having a plurality of inputs, a clock signal input, a control signal input and an output, each of said $r$ outputs of said $r$ base decoder circuits being connected to the bases of the word line transistors of a discrete row of said $r$ rows of said matrix of word line transistors;

$r$ emitter decoder circuits, each of said emitter decoder circuits having a plurality of inputs, a clock signal input, a control signal input, and an output, each of said $r$ outputs of said $r$ emitter decoder circuits being connected to the emitters of the word line transistors of a discrete column of said $r$ columns of said matrix of word line transistors;

a first group of $k$ true-complement generators, each of said $k$ true-complement generators of said group having an input for receiving a binary input, and first and second outputs for respectively providing true and complementary outputs corresponding to the binary input received by said true-complement generator, where $k$ is an integer and $2^k$ is equal in magnitude to $r$;

connection means selectively interconnecting said true and complementary outputs of said first group of $k$ true-complement generators to said plurality of inputs of each of said $r$ base decoder circuits;

a second group of $k$ true-complement generators, each of $k$ true-complement generators of said second group having an input for receiving a binary input, and first and second outputs for respectively providing true and complementary outputs corresponding to the binary input received by said true-complement generator, where $k$ is an integer and $2^k$ is equal in magnitude to $r$;

connection means selectively interconnecting said true and complementary outputs of said second group of $k$ true-complement generators to said plurality inputs of each of said $r$ emitter decoder circuits;

a clock signal source connected to said clock signal input of each of said $r$ base decoder circuits and to said clock signal input of each of said $r$ emitter decoder circuits;

and a control signal source connected to said clock signal source, to each of said control signal inputs of said $r$ base decoder circuits and to each of said control signal inputs of said $r$ emitter decoder circuits.

20. In a monolithic memory chip having at least one decoder circuit, said decoder circuit comprising:

logical circuit input means;

output driver circuit means; and fast turn-on over drive circuit means connected between said output driver means and said logical circuit input means, said fast turn-on over drive circuit means including, a first transistor of a first conductivity type having a collector, base and emitter, second and third transistors of a second conductivity type opposite to said first conductivity type, said second and third transistors each having a collector, base and emitter, a direct connection between the base of said first transistor and said collector of said second transistor, a direct connection between the emitter of said second transistor and said collector of said third transistor, and a resistor connected across the emitter/collector of said second transistor.

* * * * *

UNITED STATES PATENT AND TRADEMARK OFFICE
CERTIFICATE OF CORRECTION

PATENT NO. : 4,007,451

DATED : February 8, 1977

INVENTOR(S) : Klaus Heuber et al.

It is certified that error appears in the above-identified patent and that said Letters Patent are hereby corrected as shown below:

Column 5, line 49     "PS0-PS21" should read --PS0-PS2--.

Column 12, line 38    "output $A_k$," should read --output $\bar{A}_k$,--.

Column 13, line 67    "sais" should read --said--.

Signed and Sealed this

Third Day of October 1978

[SEAL]

Attest:

RUTH C. MASON
*Attesting Officer*

DONALD W. BANNER
*Commissioner of Patents and Trademarks*